United States Patent
Fox, III et al.

(10) Patent No.: US 10,153,232 B2
(45) Date of Patent: Dec. 11, 2018

(54) CRACK STOP WITH OVERLAPPING VIAS

(71) Applicant: GLOBALFOUNDRIES Inc., Grand Cayman (KY)

(72) Inventors: Robert J. Fox, III, Greenfield Center, NY (US); Kevin M. Boyd, Ballston Spa, NY (US); Nicholas A. Polomoff, Irvine, CA (US); Roderick A. Augur, Saratoga Springs, NY (US); Jeannine M. Trewhella, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/498,083

(22) Filed: Apr. 26, 2017

(65) Prior Publication Data

US 2018/0315707 A1 Nov. 1, 2018

(51) Int. Cl.

| H01L 23/52 | (2006.01) |
|---|---|
| H01L 23/528 | (2006.01) |
| H01L 23/522 | (2006.01) |
| H01L 23/00 | (2006.01) |

(52) U.S. Cl.
CPC ...... *H01L 23/5283* (2013.01); *H01L 23/5226* (2013.01); *H01L 23/562* (2013.01)

(58) Field of Classification Search
CPC .......................... H01L 23/5226; H01L 23/562
USPC ......................................................... 257/774
See application file for complete search history.

(56) References Cited

U.S. PATENT DOCUMENTS

| 6,022,791 A | 2/2000 | Cook et al. |
|---|---|---|
| 6,495,918 B1 | 12/2002 | Brintzinger |
| 7,479,699 B2 * | 1/2009 | Ning .................. H01L 23/562 |
| | | 257/750 |
| 7,741,715 B2 | 6/2010 | Kim et al. |
| 8,004,066 B2 | 8/2011 | Kim et al. |
| 9,305,886 B2 * | 4/2016 | Shao .................. H01L 23/562 |

FOREIGN PATENT DOCUMENTS

WO        0221594 A2     3/2002

* cited by examiner

*Primary Examiner* — Mark Prenty
(74) *Attorney, Agent, or Firm* — Yuanmin Cai; Hoffman Warnick LLC (57) ABSTRACT

A crack stop structure for an integrated circuit (IC) structure is disclosed. The structure can include: a first crack stop pillar laterally separated from a second crack stop pillar within an insulator region of the IC structure. The first crack stop pillar can include an overlapping via in contact with a top surface and at least one side surface of a first conductive element therebelow. The overlapping via of the first crack stop pillar may be in a given layer of the IC structure, and the second crack stop pillar may include a via in the given layer, the via extending to a different depth than the overlapping via. The via of the second crack stop pillar may be an overlapping via in contact with a top surface and at least one side surface of a second conductive element therebelow.

17 Claims, 6 Drawing Sheets

CRACK STOP WITH OVERLAPPING VIAS

BACKGROUND

Technical Field

Aspects of the disclosure relate generally to integrated circuits (ICs). More specifically, embodiments of the present disclosure include an IC structure with and method for forming a crack stop with vias of different depths in each via layer therein.

Related Art

Each IC of a particular device can be made up of billions of interconnected devices, such as transistors, resistors, capacitors, and diodes, located on one or more chips of semiconductor substrate material. The quality and viability of a product including an IC therein can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal layer," i.e., a metal wire for connecting several semiconductor devices together. BEOL generally includes fabrication processes following the formation of the first metal layer, including the formation of all subsequent metal layers. To provide greater scaling and sophistication of the fabricated device, the number of metal layers can be varied to suit a particular application, e.g., by providing four to six metal layers, or as many as, in a further example, sixteen or more metal layers.

As the total number of devices in each IC product continues to increase, the resilience of an IC structure to side-effects of processing and/or general wear has become increasingly significant. For example, the separation of metal layers from one another (i.e., delamination) during a dicing process can become significant where cracks form at the perimeter edge of a product and propagate toward the devices included therein. Even where dummy materials (sometimes known as "crack stops") are formed near the perimeter edge of a manufactured device to prevent or slow the growth of a crack, a formed crack may nevertheless circumvent the crack stop in some instances.

SUMMARY

A first aspect of the disclosure provides a crack stop structure for an integrated circuit (IC) structure including: a first crack stop pillar laterally separated from a second crack stop pillar within an insulator region of the IC structure, wherein the first crack stop pillar includes an overlapping via in contact with a top surface and at least one side surface of a first conductive element therebelow.

A second aspect of the disclosure provides a crack stop structure for an integrated circuit (IC) structure including: a first crack stop pillar positioned within an insulator region, the first crack stop pillar including a plurality of alternating stacked vias and metal layers; and a second crack stop pillar positioned within the insulator region, the second crack stop pillar laterally separated from the first crack stop pillar, the second crack stop pillar including a plurality of stacked vias and a plurality of stacked metal layers, wherein the first crack stop pillar includes a first via in a first given layer of the IC, and the second crack stop pillar includes a second via in the first given layer, and wherein the first via and the second via in the first given layer extend to different depths.

A third aspect of the disclosure provides a crack stop structure for an integrated circuit (IC) structure including: a plurality of crack stop pillars in an insulator region of the IC, each crack stop pillar laterally separated from one another, wherein each crack stop pillar includes a plurality of alternating vias and metal wires, and wherein at least one via in at least one crack stop pillar of the plurality of crack stop pillars is an overlapping via in contact with a top surface and at least one side surface of a conductive element therebelow.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide integrated circuit (IC) structures with a crack stop structure, including crack stop pillars for impeding or altogether preventing delamination cracks from propagating away from a perimeter edge of the IC to active devices therein. Among other things, IC structures according to the present disclosure can include crack stop pillars with vias of different depths proximate in crack stop regions of the IC.

Figure 1:
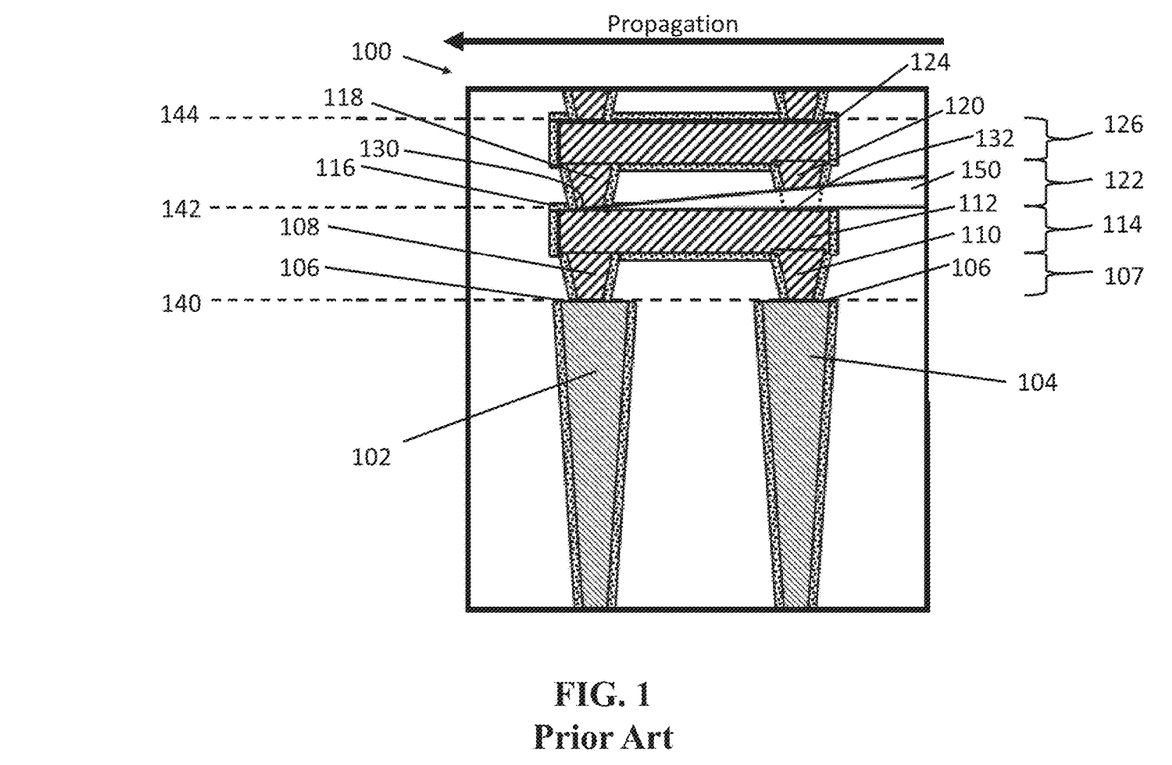
FIG. 1 shows a cross-sectional view of a portion of a prior art crack stop structure for an integrated circuit (IC) structure, including a propagating delamination crack.

FIG. 1 shows an example of a portion of a prior art crack stop structure for an integrated circuit (IC). Conventional crack stop structure 100 may be formed, for example, over a pair of operative contacts 102, 104. Operative contacts 102, 104 may be formed, for example, over a substrate including a device layer (not shown). Conventional crack stop structure 100 may include alternating via layers and metal layers. For example, an initial set of vias 108, 110, in an initial via layer 107 may be aligned over operative contacts 102, 104 to contact flush with a top surface 106 of operative contacts 102, 104. Vias 108,110 may be connected by a first metal wire 112 in a first metal layer 114. Further, a second set of vias including vias 118, 120 (via 120 partially in phantom in FIG. 1), in a first via layer 122 may be aligned over first metal wire 112 flush with a top surface 116 of first metal wire 112. Vias 118, 120 may be connected by a second metal wire 124 in a second metal layer 126. As shown in FIG. 1, in a conventional crack stop structure 100, vias in each via layer are approximately the same depth. As a result, as illustrated by phantom lines 140, 142, 144, interfaces between each via of a given via layer, and a conductive element (e.g., metal wire 112) therebelow are approximately planar with one another. For example, an interface (not labeled) between via 118 and a top surface 116 of metal wire 112 may be approximately planar with an interface (not labeled) between via 120 (partially in phantom) and a top surface of 116 of metal wire 112.

During stress events such as the dicing of chips from a larger structure, a delamination crack 150 may propagate horizontally from a perimeter edge (not shown) of an IC structure toward a die (not shown). Conventional crack stop structure 100 may be located between the die and the point of initiation of delamination crack 150 to prevent propagation of delamination crack 150 from reaching the die. Delamination crack 150 may propagate in an unobstructed path, through conventional crack stop structure 100 along the approximately planar interfaces of each via set discussed above. For example, delamination crack 150 may propagate through conventional crack stop structure 100 along interfaces 130, 132 between vias 118, 120 of first via layer 122 and first metal wire 112. Delamination crack 150 may propagate through or "unzip" as many as all of the interfaces (e.g., 130, 132) between vias in the same via layer (e.g., via layer 122) and a metal layer therebelow (e.g., second metal wire 112). Delamination cracks reaching the die may allow moisture to penetrate the die resulting in failures within the IC.

Figure 2:
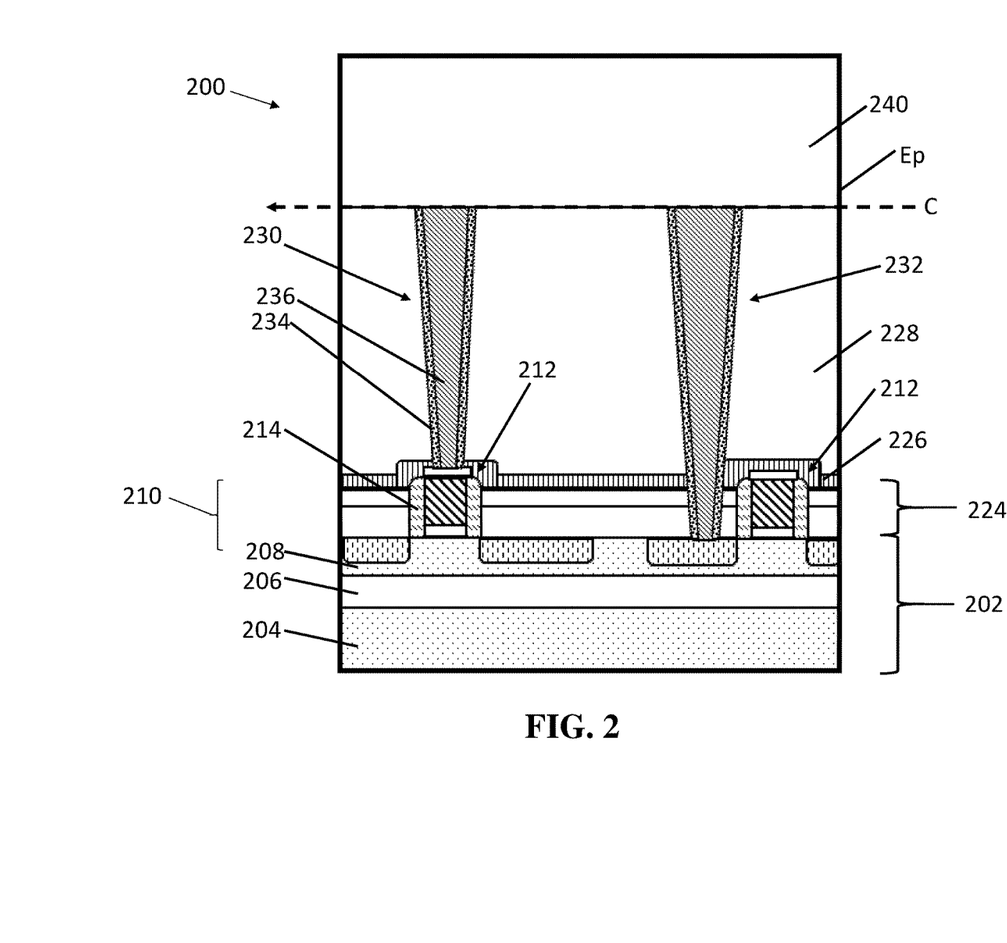
FIG. 2 shows a cross-sectional view of a portion of an initial IC structure for forming a crack stop structure, according to embodiments.

Referring to FIG. 2, embodiments of an example initial IC structure 200 for forming a set of crack stop pillars with vias of different depths, according to the disclosure, is shown. Structure 200 may include a semiconductor-on-insulator (SOI) substrate 202 which may include a base substrate 204, an insulator layer 206 and a semiconductor-on-insulator (SOI) layer 208 therein. Initial structure 200 may also include a device layer 210 and non-operative contacts 230, 232, as discussed herein Base substrate 204 and SOI layer 208 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. For example, SOI layer 208 (and/or epi layer thereover) may be strained.

SOI layer 208 can also include, e.g., shallow trench isolations (STIs) (not shown) positioned laterally between discrete elements of device layer 210. Such STI(s) can be formed from one or more regions of insulating material, and may be formed by removing portions of SOI layer 208 to form trenches and then filling the trenches with an electrically insulative material, e.g., one or more of the insulating materials described elsewhere herein. STI(s) within device layer 210 are omitted from the accompanying FIGS. solely for clarity of illustration.

Insulator layer 206 may include any now known or later developed dielectric used for SOI layers, such as but not limited to silicon dioxide or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer 206 and topmost SOI layer 208 also vary widely with the intended application. Insulator layer 206 may be positioned, for example directly beneath device layer 210.

Device layer 210 may include silicon-on-insulator (SOI) layer 208 provided as a layer of semiconductive material, and on and/or in which one or more transistor structures 212 and an overlapping dielectric 214 (e.g., sidewall spacers) may be formed. It is understood that embodiments of the present disclosure may be formed in and/or proximal to portions of device layer 210 without transistor structures 212 formed therein. Device layer 210 may be formed according to conventional processes.

Device layer 210 may, for example, also include an insulator 224 positioned over SOI layer 208 and/or transistor structures 212, where applicable. In addition, insulator 212 can be positioned over device layer 210 to provide electrical insulation and physical separation between components of device layer 210 and overlying elements. Insulator 222 may include any currently-known or later developed material for providing electrical insulation. The insulating quality of a material may be characterized by "K," the dielectric constant. For example, insulator 224 may be composed of any insulating material such as $SiO_2$ or a "high-K" dielectric having a high dielectric constant (where "K" denotes the material's dielectric constant), which may be, for example, above 3.9. In some situations, insulator 224 may be composed of an oxide substance. Insulator 224 m initially be formed as a single, continuous layer or group of insulating layers, each of which can be separately processed to include trenches, cavities, etc. Materials appropriate for the composition of insulator 224 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties. The insulating quality of a material may be characterized by "K," the dielectric constant. For example, insulator 224 may be composed of any insulating material such as $SiO_2$ or a "high-K" dielectric having a high dielectric constant (where "K" denotes the material's dielectric constant), which may be, for example, above 3.9. In some situations, insulator material may be composed of an oxide substance. As is known in the art, the properties of insulator 224, including the magnitude of each layer's dielectric constant for each layer, can allow for different types of layers to serve as, e.g., a "high-K" layer, a "low-K" layer, an "ultra low-K" layer, etc.

Initial structure 200 may, for example, also include a contact etch stop layer (CESL) 226 formed over device layer 210. CESL 226 may include any now known or later developed etch stop material such as silicon nitride. In one embodiment, CESL 226 includes a stress therein, e.g., compressive or tensile, so as to impart a strain to at least part of device layer 210, in a known fashion.

Initial structure 200 may, for example, include a dielectric layer 228 formed over CESL 226, e.g., by deposition. Dielectric layer 228 may include may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Initial structure 200 may, for example, include non-operative contacts 230, 232 through dielectric layer 228 and/or CESL 226 and/or insulator 224 to transistor structure 212 and/or a portion of source/drain regions 218. Non-perative contacts 230, 232 may include, for example, a liner 234 and conductor fill 236. Liner 234 may include any conventional liner material such as ruthenium; however, other refractory metals such as tantalum (Ta), titanium (Ti), tungsten (W), iridium (Jr), rhodium (Rh) and platinum (Pt), etc., or mixtures of thereof, may also be employed. Conductor 136 may include, for example, copper or tungsten. It is emphasized that method of forming non-operative contacts 230, 232 may include any variety of intermediate steps not described herein but understood with those with skill in the art. Non-operative contacts 230, 232 may be formed by any now known or later developed techniques for forming contacts.

Initial structure 200 may, for example, include a second dielectric layer 240 formed over non-operative contacts 230, 232 and dielectric layer 228, e.g., by deposition. Dielectric layer 240 may include may include any interlevel or intralevel dielectric material as noted herein.

Initial structure 200 may be formed using any now known or later developed semiconductor fabrication techniques including by not limited to photolithography (and/or sidewall image transfer (SIT)). In lithography (or "photolithography"), a radiation sensitive "resist" coating is formed, e.g., deposited, over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

At this point in conventional processing, conventional crack stop structures (e.g., conventional crack stop structure 100 of FIG. 1) may be formed over non-operative contacts 230, 232. As discussed above with respect to FIG. 1, during stress events such as the dicing of chips from a larger structure, delamination cracks traveling horizontally from perimeter edge, e.g., $E_P$ of initial structure 200, along line C at an interface between second dielectric layer 240 and dielectric layer 228 and/or non-operative contacts 230, 232 and vias 108, 110 (see FIG. 1) as shown in FIG. 2. That is, delamination cracks propagating along these interfaces would "unzip" the interfaces and continue to propagate to the die which may result in failures within the IC.

Although initial structure 200 is shown in FIG. 2 as including non-operative contacts 230, 232 on a source/drain region and/or transistor, initial structure 200 for forming crack stop structure 300 (FIGS. 3-6) according to embodiments of the disclosure may alternatively include vias to any desirable portion of the IC to prevent delamination crack propagation. For example, although a device layer 210 is shown in FIG. 2, embodiments of the disclosure may include a SOI substrate portion of the IC without device layer 210. Although non-operative contacts 230, 232 are shown, initial structure 200 may include operative contacts, and/or any desirable structure for forming a crack stop structure thereon.

As shown in FIGS. 3-6, in contrast to conventional processing, embodiments of the disclosure include forming a crack stop structure 300 (FIGS. 3-6) including crack stop pillars with vias of different depths in each via layer. The term "overlapping via" as used herein may include any via in contact with a top surface and at least one side surface of a conductive element therebelow. The term "flush via" as used herein may include any via with a bottom surface that is approximately flush with a top surface but does not contact a side of a conductive element therebelow. Conductive elements may, for example, include metal wires, operative contacts, non-operative contacts, and any other desirable conductive element for an IC. Although FIGS. 3-6 show crack stop structure 300 as including two crack stop pillars (e.g., crack stop pillars 302, 304 of FIG. 4), crack stop structure 300 may include any desirable number of crack stop pillars for preventing delaminating crack propagation.

Flush vias (e.g., flush via 310 of FIG. 3) may be formed from any now known or later developed semiconductor manufacturing techniques for forming vias. For example, flush via 311 of FIG. 3 may be formed by etching an opening (not shown) in second dielectric layer 240 aligned with a top surface 314 of non-operative contact 230 therebelow and depositing a desirable via material therein. Overlapping vias (e.g., overlapping vias 312 of FIG. 3) may be formed, for example, by intentionally drawing the via shape larger than the underlying conductive element for an RIE process and/or any now known or layer developed semiconductor manufacturing techniques for forming vias. For example, overlapping via 312 of FIG. 3 may be formed by etching an opening (not shown) in second dielectric layer 240 misaligned with a top surface 316 of non-operative contact 232 therebelow and depositing a desirable via material therein. Flush vias and overlapping vias may be formed from any now known or later developed materials desirable for forming vias, for example in a crack stop structure. Flush vias and overlapping vias may, for example, include a liner (not labeled) formed by any now known or later developed techniques for forming via liners and formed from any now known or later developed materials desirable for forming a liner in a via. Metal layers (e.g., metal layer M1 of FIG. 3) including metal wires (e.g., metal wires 320, 322 of FIG. 3) may be formed by any now known or later developed semiconductor manufacturing techniques for forming metal layers including metal wires. Metal layers including metal wires may be formed from any now known or later developed materials desirable for metal layers including metal wires in an IC.

Figure 3:
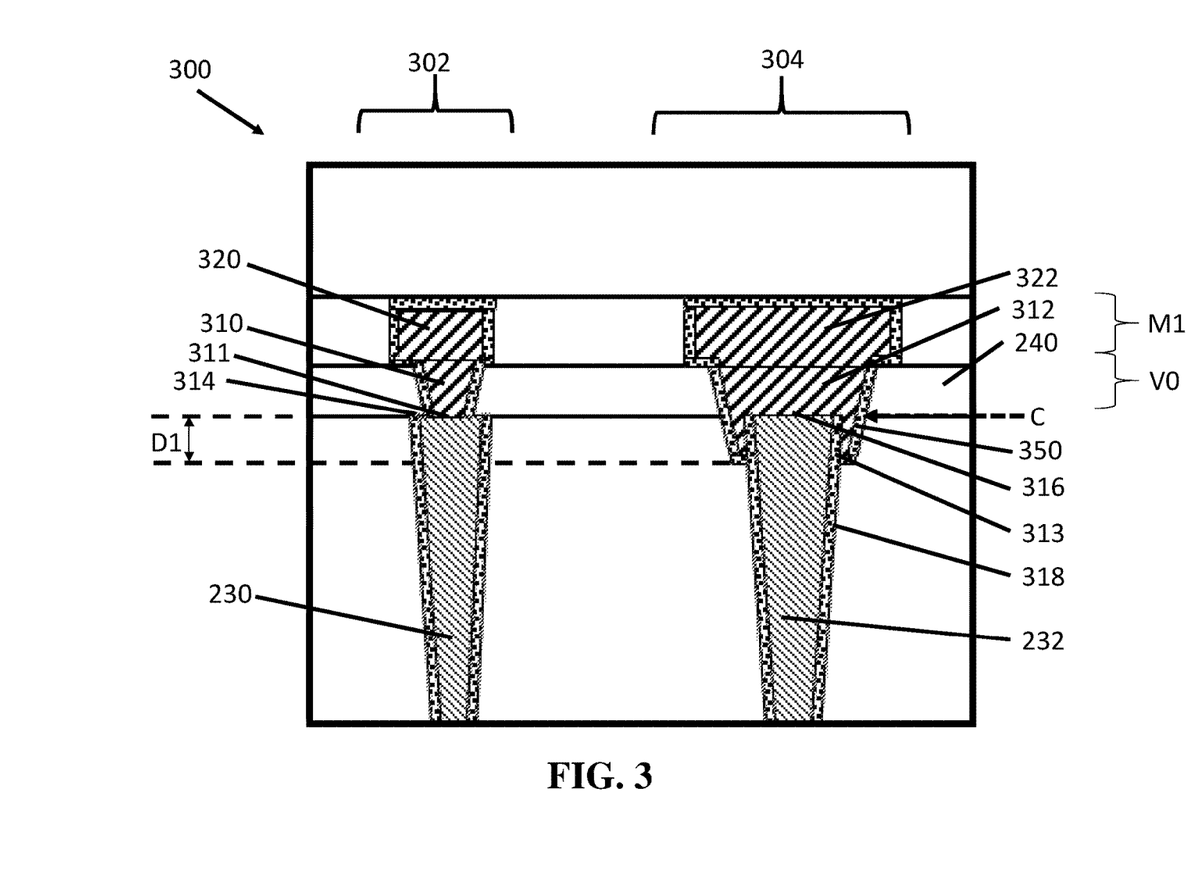
FIG. 3 shows a cross-sectional view of forming a first via layer and a first metal layer of the crack stop structure, according to embodiments.

FIG. 3 shows forming an initial via layer V0 including vias of different depths, and first metal layer M1 of crack stop structure 300. Crack stop structure 300 may include crack top pillars 302, 304. Initial via layer V0 may include flush via 310 of crack stop pillar 302 and overlapping via 312 of crack stop pillar 304. Flush via 310 may be formed, for example, over non-operative contact 230 and overlapping via 312 may be formed, for example, over non-operative contact 232. As shown in the example of FIG. 3, flush via 310 may be flush on a top surface 314 of non-operative contact 230. As shown in the example of FIG. 3, overlapping via 312 may be in contact with a top surface 316 and a portion of side surfaces 318 of non-operative contact 232. First metal layer M1 may include, for example, metal wire 320 of crack top pillar 302, and metal wire 322 of crack stop pillar 304. As shown in the example FIG. 3, metal wire 320 may be formed over flush via 310, and metal wire 322 may be formed over overlapping via 312.

As illustrated by the phantom lines in the example of FIG. 3, overlapping via 312 may include a different depth than flush via 310. For example, a lowermost surface 311 of flush via 310 may be vertically separated from a lowermost surface 313 of overlapping via 312 by a depth difference of D1. Overlapping via 312 may for example impede and/or altogether prevent the propagation of a delaminating crack. For example, as a delamination crack propagates along path C shown in FIG. 3, the delamination crack may reach a side surface 350 of overlapping via 312 and may be impeded or prevented from propagating further. Depth difference D1 may include any desirable depth for overlapping via 312 to impede or altogether prevent the propagation of a delamination crack.

Figure 4:
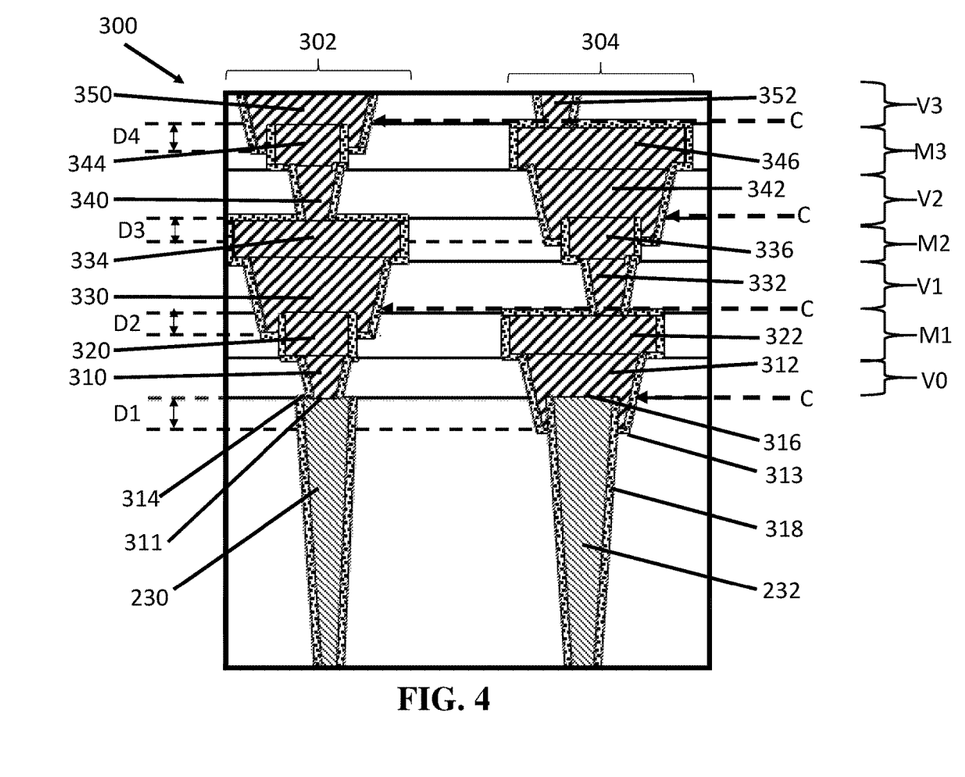
FIG. 4 shows a cross-sectional view of a portion of a crack stop structure, according to embodiments.

FIG. 4 shows an embodiment of a portion of crack stop structure 300 including crack stop pillars 302, 304 with vias of different depths in each via layer according to embodiments of the disclosure. Crack stop structure 300 may include, for example, via layers V0, V1, V2, V3, alternating with metal layers M1, M2, M3. Initial via layer V0 may include, for example, flush via 310 and overlapping via 312 as discussed with respect to FIG. 3. First metal layer M1 may include metal wires 320, 322 as discussed with respect to FIG. 3. As illustrated in FIG. 4, first via layer V1 may be formed above first metal layer M1 (see also FIG. 3) and include, for example, overlapping via 330 of crack stop pillar 302 and flush via 340 of crack stop pillar 304. Crack stop structure 300 may also include for example, second metal layer M2 above first via layer V3 including metal wires 334, 336; second via layer V2 above second metal layer M2 including flush via 340 and overlapping via 342; third metal layer M3 above second via layer V2 including metal wires 344, 346; third via layer V3 above third metal layer M3 including overlapping via 350 and flush via 352; etc.

Figure 5:
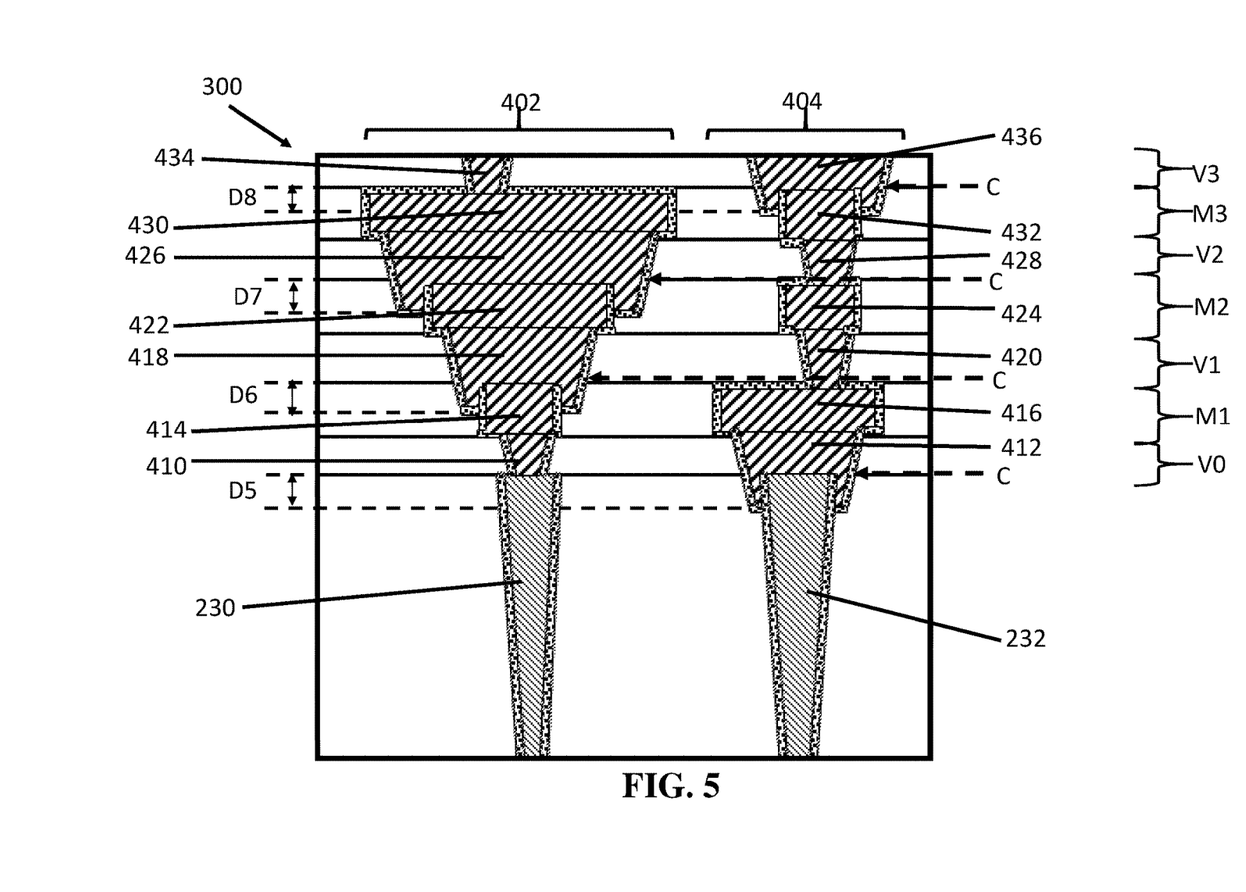
FIG. 5 shows a cross-sectional view of a portion of a crack stop structure, according to embodiments.
Figure 6:
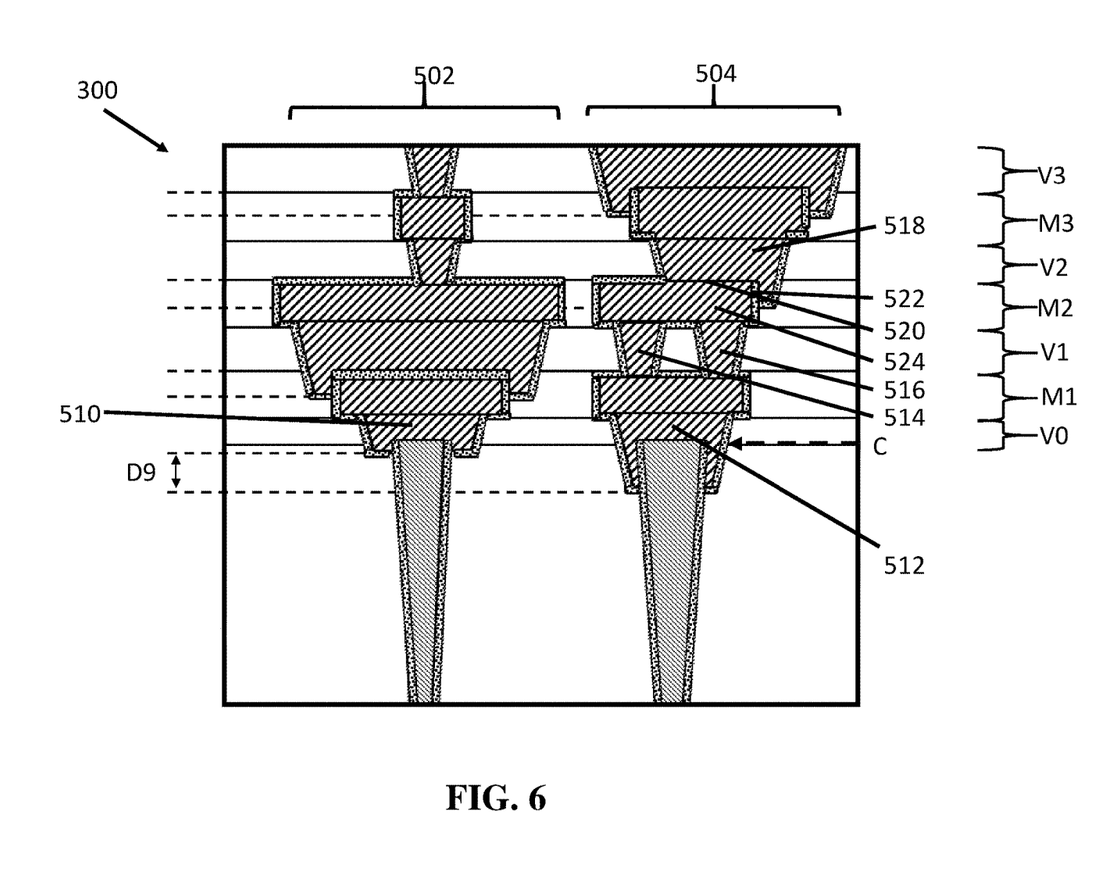
FIG. 6 shows a cross-sectional view of a portion of a crack stop structure, according to embodiments.

Crack stop pillars 302, 304 may include any number and any combination of overlapping vias and/or flush vias to form crack stop structure 300 with vias of different depths in each via layer (e.g., see also FIGS. 5-6 for examples). For example, as shown in FIG. 4, crack stop pillars 302 and 304 may each include alternating flush vias and overlapping vias with metal wires therebetween. For example, crack stop pillar 302 may include flush via 310 on top surface 314 of non-operative contact 230; metal wire 320 above flush via 310; overlapping via 330 in contact with top surface (not labeled) and a portion of side surfaces (not labeled) of metal wire 320; metal wire 344 above overlapping via 330; flush via 340 above a top surface (not labeled) of metal layer 334; metal layer 344 above flush via 340; overlapping via 350 in contact with a top surface (not labeled) and side surfaces (not labeled) of metal wire 344; etc. In another example, crack stop pillar 304 may include overlapping via 312 in contact with top surface 316 and side surfaces 318 of non-operative contact 232; metal wire 322 above overlapping via 312; flush via 332 above a top surface (not labeled) of metal wire 322; metal wire 336 above flush via 332; overlapping via 342 in contact with a top surface (not labeled) and side surfaces (not labeled) of metal wire 336; metal wire 346 above overlapping via 346; and flush via 352 above a top surface (not labeled) of metal wire 346.

As shown in FIG. 4, crack stop structure 300 with crack stop pillars 302, 304 each having alternating flush vias and overlapping vias (with metal wires therebetween) may include a flush via and an overlapping via in each via layer. For example, initial via layer V0 may include flush via 310 and overlapping via 312; first via layer V1 may include overlapping via 330 and flush via 332; second via layer V2 may include flush via 340 and overlapping via 342; and third via layer V3 may include overlapping via 350 and flush via 352.

As illustrated by the phantom lines in the example of FIG. 4, each via layer V0, V1, V2, V3 of crack stop structure 300 having a flush via and an overlapping via may include a different via depths. The depth difference between vias in each via layer may, for example, be based on the distance between the lowermost surfaces of the vias in a via layer. For example, flush via 310 and overlapping via 312 of initial via V0 may have a depth difference of D1. Overlapping via 330 and flush via 332 of first via layer V1 may have, for example, a depth difference of D2. Flush via 340 and overlapping via 342 of second via layer V2 may have, for example, a depth difference of D3. Overlapping via 350 and flush via 352 of third via layer V3 may have, for example, a depth difference of D4. Overlapping vias 312, 330, 342, 350 may for example impede and/or altogether prevent the propagation of a delaminating crack. For example, as a delamination crack propagates along any of the paths C shown in FIG. 4, the delamination crack may reach a side surface of overlapping vias 312, 330, 342, 350 and may be impeded or prevented from propagating further. Depth differences D1, D2, D3, D4 may include any desirable depth for overlapping vias 312, 330, 342, 350 to impede or altogether prevent the propagation of a delamination crack. For example, depth differences D1, D2, D3, D4 may include approximately 10 nanometers (nm) to approximately 100 nm. Depth differences D1, D2, D3, D4 may include smaller and/or larger depths based on the technology nodes. Depth differences D1, D2, D3, D4 may, for example, include the same depth difference. Alternatively, depth differences D1, D2, D3, D4 may include any combination of depth differences.

FIG. 5 shows an example crack stop structure 300 according to embodiments of the disclosure. Crack stop structure 300 may include, for example, alternating via layers V0, V1, V2, V3 and metal layers M1, M2, M3. Crack stop structure 300 may include crack stop pillars 402, 404 including vias of different depths, e.g., flush vias and overlapping vias, in each via layer.

As discussed with respect to FIG. 4 above, via layers and crack stop pillars of crack stop structure 300 may include, for example, any number and any combination of flush vias and overlapping vias. As shown in the example of FIG. 5, crack stop pillar 402 may include consecutive via layers V1, V2 with metal layer M2 therebetween. Consecutive via layers V1, V2 may, for example, each include overlapping vias 418, 426. Although FIG. 5 illustrates crack stop pillar 402 as including overlapping vias 418, 426, in two consecutive via layers V1, V2, a crack stop pillar of crack stop structure 300 may include overlapping vias in as many as all via layers. As shown in example of FIG. 5, crack stop pillar 404 may include flush vias 420, 428 in consecutive via layers V1, V2, respectively. Although FIG. 5 illustrates crack stop pillar 414 as including flush vias 420, 428 in two consecutive via layers V1, V2, a crack stop pillar of crack stop structure 300 may include flush vias in as many as all via layers.

As illustrated by the phantom lines in the example of FIG. 5 even where crack stop pillars may include overlapping vias in consecutive via layers and/or flush vias in consecutive via layer, vias within each via layer may still include a different depth than one another. The depth difference between vias in each via layer may, for example, be based on the distance between the lowermost surfaces of the vias in a via layer. For example, the vias of first via layer V1 may include a depth difference D6 and the vias of second via layer V2 may include a depth difference D7. Overlapping vias 412, 418, 430, 436 may for example impede and/or altogether prevent the propagation of a delaminating crack. For example, as a delamination crack propagates along any of the paths C shown in FIG. 5, the delamination crack may reach a side surface of overlapping vias 412, 418, 430, 436 and may be impeded or prevented from propagating further. Depth differences D5, D6, D7, D8 may include any desirable depth for overlapping vias 412, 418, 430, 436 to impede or altogether prevent the propagation of a delamination crack. Depth differences D5, D6, D7, D8 may, for example, include the same depth difference. Alternatively, depth differences D5, D6, D7, D8 may include any combination of depth differences.

FIG. 6 shows an example crack stop structure 300 according to embodiments of the disclosure. Crack stop structure 300 may include, for example, alternating via layers V0, V1, V2, V3 and metal layers M1, M2, M3. Crack stop structure 300 may include crack stop pillars 502, 504 including vias of different depths, e.g., flush vias and overlapping, in each via layer.

As discussed with respect to FIGS. 4 and 5 above, via layers and crack stop pillars of crack stop structure 300 may include any number and any combination of flush vias and overlapping vias. As shown in the example of FIG. 6, crack stop pillars 502, 504 may each include an overlapping via, overlapping vias (e.g., overlapping vias 510, 512) in the same via layer (e.g., initial via layer V0). Although FIG. 6 illustrates crack stop pillars 502, 504 as each including overlapping in initial via layer V0, crack stop pillars of crack stop structure 300 may each include overlapping vias in any same via layer and/or as many as all via layers. For example, although not shown, the vias of crack stop pillars 502, 504 may all include overlapping vias.

As illustrated by the phantom lines in the example of FIG. 6 even where crack stop pillars of crack stop structure 300 may each include overlapping vias in the same via layer, the vias in each via layer may still include a different depth than one another. The depth difference between vias in each via layer may, for example, be based on the distance between the lowermost surfaces of the vias in a via layer. For example, the vias of initial via layer V0 may include a depth difference D9. Overlapping via 512 may for example impede and/or altogether prevent the propagation of a delaminating crack. For example, as a delamination crack propagates along paths C shown in FIG. 6, the delamination crack may reach a side surface of overlapping via 512 and may be impeded or prevented from propagating further. Depth difference D9 may include any desirable depth for overlapping via 512 to impede or altogether prevent the propagation of a delamination crack.

Although FIGS. 4-5 show the crack stop pillars of crack stop structure 300 as each including one via in each via layer, each crack stop pillar may include any number of vias in each via layer as may be desirable for crack stop structure 300. For example, as shown in FIG. 6, crack stop pillar 504 may include two vias 514, 516 in first via layer V1.

Although FIGS. 4-5 show overlapping vias of crack stop structure 300 in contact with a top surface and a portion of each side surface of a conductive element therebelow (e.g., overlapping via 312 of FIG. 3), overlapping vias may be in contact with a portion of a top surface and a portion of only one side surface of a conductive element therebelow. For example, as shown in FIG. 6, crack stop pillar 504 may include via 518 in contact with a portion of a top surface 520 and a portion of one side surface 522 of a metal wire 524 therebelow.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A crack stop structure for an integrated circuit (IC) structure comprising:
   a first crack stop pillar laterally separated from a second crack stop pillar within an insulator region of the IC structure, wherein the first crack stop pillar includes an overlapping via in contact with a top surface and at least one side surface of a first conductive element therebelow, and
   wherein the overlapping via of the first crack stop pillar is in a given layer of the IC structure, and the second crack stop pillar includes a via in the given layer, the via extending to a different depth than the overlapping via.

2. The crack stop structure of claim 1, wherein the conductive element includes a non-operative contact.

3. The crack stop structure of claim 1, wherein the conductive element includes a metal wire.

4. The crack stop structure of claim 1, wherein the via of the second crack stop pillar is an overlapping via in contact with a top surface and at least one side surface of a second conductive element therebelow.

5. The crack stop structure of claim 4, wherein the second conductive element includes a non-operative contact.

6. The crack stop structure of claim 4, wherein the second conductive element includes a metal wire.

7. The crack stop structure of claim 1, wherein the via of the second crack stop pillar is a flush via flush with a top surface of a second conductive element.

8. The crack stop structure of claim 7, wherein the second conductive element includes an operative contact.

9. The crack stop structure of claim 7, wherein the second conductive element includes a metal wire.

10. A crack stop structure for an integrated circuit (IC) structure comprising:
    a first crack stop pillar positioned within an insulator region, the first crack stop pillar including a plurality of alternating stacked vias and metal layers, wherein at least one via of the first crack stop pillar is an overlapping via in contact with a top surface and at least one side surface of a conductive element therebelow; and
    a second crack stop pillar positioned within the insulator region, the second crack stop pillar laterally separated from the first crack stop pillar, the second crack stop pillar including a plurality of stacked vias and a plurality of stacked metal layers,
    wherein the first crack stop pillar includes a first via in a first given layer of the IC, and the second crack stop pillar includes a second via in the first given layer, and wherein the first via and the second via in the first given layer extend to different depths.

11. The crack stop structure of claim 10, wherein at least one via of the first crack stop pillar is a flush via flush with a top surface of a conductive element therebelow.

12. The crack stop structure of claim 10, wherein each via of the first crack stop pillar is an overlapping via in contact with a top surface and at least one side surface of a conductive element therebelow.

13. The crack stop structure of claim 10, wherein the first via in the first given layer is a first overlapping via in contact with a top surface and at least one side surface of a first conductive element therebelow.

14. The crack stop structure of claim 13, wherein the second via in the first given layer is a first flush via flush with a top surface of a second conductive element therebelow.

15. The crack stop structure of claim 13, wherein the second via in the first given layer is an overlapping via in contact with a top surface and at least one side surface of a second conductive element therebelow.

16. The crack stop structure of claim 10, wherein the vias of the first crack stop pillar include at least one overlapping via in contact with a top surface and at least one side surface of a first conductive material therebelow, and at least one flush via flush with a top surface of a second conductive material therebelow.

17. The crack stop structure of claim 16, wherein the vias of the second crack stop pillar include at least one overlapping via in contact with a top surface and at least one side surface of a first conductive material therebelow, and at least one flush via flush a top surface of a second conductive material therebelow.

* * * * *